(12) United States Patent
Fan et al.

(10) Patent No.: US 7,609,525 B2
(45) Date of Patent: Oct. 27, 2009

(54) COMPUTER SYSTEM

(75) Inventors: Chen-Lu Fan, Taipei Hsien (TW); Li-Ping Chen, Taipei Hsien (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 275 days.

(21) Appl. No.: 11/608,806

(22) Filed: Dec. 9, 2006

(65) Prior Publication Data

US 2008/0137286 A1   Jun. 12, 2008

(51) Int. Cl.
H05K 5/00 (2006.01)
H05K 7/00 (2006.01)
G06F 1/16 (2006.01)

(52) U.S. Cl. .................. 361/752; 361/748; 361/679.02; 312/223.2

(58) Field of Classification Search ................. 361/687, 361/679.02, 748, 752; 312/223.2
See application file for complete search history.

(56) References Cited

U.S. PATENT DOCUMENTS

| 4,724,514 | A | * | 2/1988 | Kaufman | 361/710 |
|---|---|---|---|---|---|
| 5,661,640 | A | * | 8/1997 | Mills et al. | 361/801 |
| 5,978,232 | A | * | 11/1999 | Jo | 361/796 |
| 6,111,746 | A | * | 8/2000 | Wahl et al. | 361/684 |
| 6,377,445 | B1 | * | 4/2002 | Davis et al. | 361/752 |
| 6,384,331 | B1 | * | 5/2002 | Ku | 174/548 |
| 6,549,410 | B1 | * | 4/2003 | Cohen | 361/704 |
| 6,639,804 | B1 | * | 10/2003 | Chen | 361/719 |
| 6,717,815 | B2 | * | 4/2004 | Yang | 361/719 |
| 6,741,477 | B2 | * | 5/2004 | Sivertsen | 361/752 |
| 6,813,161 | B2 | * | 11/2004 | Le et al. | 361/758 |
| 6,859,367 | B2 | * | 2/2005 | Davison | 361/704 |
| 6,906,266 | B2 | | 6/2005 | Verrigni | |
| 6,937,475 | B2 | * | 8/2005 | Rigimbal et al. | 361/752 |
| 7,042,727 | B2 | * | 5/2006 | Ulen et al. | 361/704 |
| 7,184,277 | B2 | * | 2/2007 | Beirne | 361/807 |
| 7,254,028 | B2 | * | 8/2007 | Lee et al. | 361/704 |
| 2004/0196637 | A1 | * | 10/2004 | Le et al. | 361/758 |
| 2004/0212963 | A1 | * | 10/2004 | Unrein | 361/704 |
| 2005/0168927 | A1 | * | 8/2005 | Chen et al. | 361/683 |
| 2005/0276007 | A1 | * | 12/2005 | Fan et al. | 361/683 |
| 2006/0044764 | A1 | * | 3/2006 | Kuang et al. | 361/710 |

* cited by examiner

Primary Examiner—Jayprakash N Gandhi
Assistant Examiner—Bradley H. Thomas
(74) Attorney, Agent, or Firm—Wei Te Chung

(57) ABSTRACT

A computer system includes a motherboard (10 or 50) with at least one CPU heat sink mounted thereon and a chassis (20) for mounting the motherboard therein. The chassis includes a plurality of bumps (23), and a plurality of knockdown standoffs (25). Some of the bumps are under the at least one CPU heat sink, the standoffs are mounted on the bumps under the CPU heat sink for resisting against the motherboard and supporting the CPU heat sink. Some of the bumps are spares adapted for mounting another type of motherboard to the chassis.

10 Claims, 4 Drawing Sheets

COMPUTER SYSTEM

BACKGROUND

1. Field of the Invention

The present invention relates to computer systems, and more particularly to a computer system including a chassis suitable to different types of motherboards.

2. Description of Related Art

A computer system includes a motherboard enclosed within a chassis. The motherboard provides a surface on which much of the computer's critical circuitry is mounted such as the control processing unit (CPU) and system memory. Because of the critical circuitry contained in the motherboard it is important to properly secure the motherboard within the chassis of the computer to ensure the dynamic and static stability of the motherboard.

The chassis typically is manufactured from a metal, such as galvanized steel. In order to prevent soldering tin points of the electronic components mounted on the motherboard from contacting with the chassis to form a short circuit, the chassis generally has at least one standoff extending from one face thereof, and the motherboard has a structure cooperating with the at least one standoff. However, conventionally standoffs are only configured for one type of motherboard and cannot be removed from the chassis. If a different type of motherboard is desired, a different chassis adapted to the new motherboard should be provided. It is inconvenient and wasteful.

What is needed, therefore, is a computer system having a chassis with knockdown or removably engagable standoffs adapted to mounting different types of motherboards therein.

SUMMARY

A computer system includes a motherboard with at least a CPU heat sink mounted thereon and a chassis for mounting the motherboard therein. The chassis includes a plurality of bumps and a plurality of knockdown standoffs. Some of the bumps are under the CPU heat sink, the standoffs are mounted on the bumps under the CPU heat sink for resisting against the motherboard and supporting the CPU heat sink. Some of the bumps are spares adapted for mounting another type of motherboard to the chassis.

Other advantages and novel features will be drawn from the following detailed description of a preferred embodiment with attached drawings, in which:

DETAILED DESCRIPTION OF THE INVENTION

Figure 1:
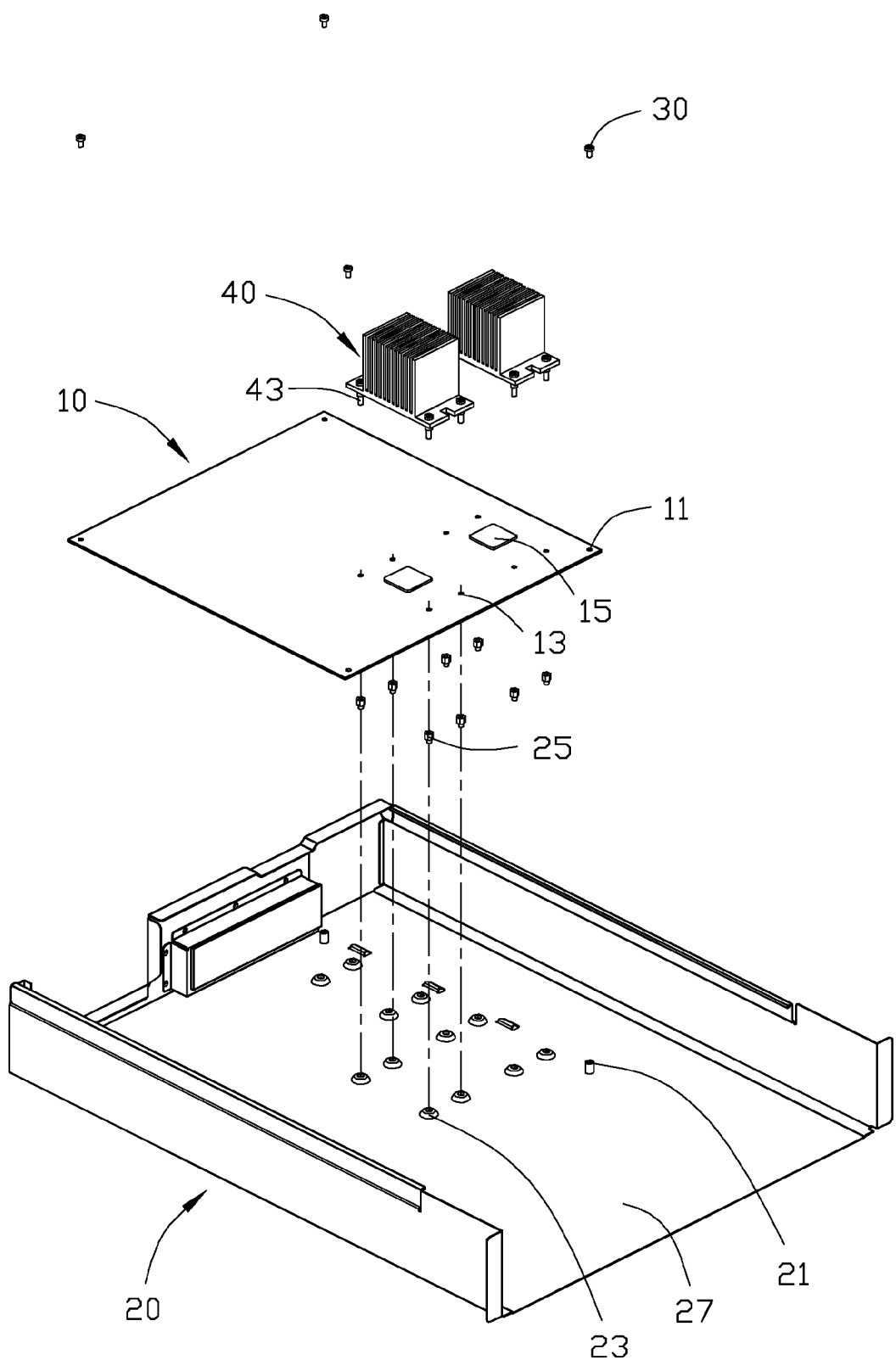
FIG. 1 is an exploded, isometric view of a computer system of a first preferred embodiment of the present invention, showing a first motherboard, a pair of heat sinks, and a chassis with knockdown standoffs adapted for the first motherboard.

Referring to FIG. 1, a computer system in accordance with a first preferred embodiment of the present invention includes a first motherboard 10, a chassis 20, a plural screws 30 for securing the first motherboard 10 to the chassis 20, and a pair of heat sinks 40 adapted to be mounted on the motherboard 10.

The first motherboard 10 includes two CPU chips 15 arrayed in-line, mounted thereon. Two groups of securing holes 13 are defined in the first motherboard 10 and located beside the CPU chips 15 respectively for mounting the heat sinks 40 on the CPU chips 15. The two groups each include four securing holes 13 beside the CPU chips 15 respectively. Four fixing holes 11 are defined in four corners of the first motherboard 10 respectively.

The chassis 20 includes a bottom panel 27. Four fixing posts 21 each with a screw hole defined therein protrude upwardly from the bottom panel 27 for engaging with the fixing holes 11 of the first motherboard 10. Three groups of bumps 23 each with a hole defined therein are formed on the bottom panel 27. Each of the three groups includes four bumps 23. Wherein two groups of bumps 23 align with the corresponding securing holes 13 of the first motherboard 10. Eight standoffs 25 are secured into the holes of the two groups of bumps 23. A mounting hole is defined in a top of each of the standoffs 25 corresponding to the securing holes 13 of the first motherboard 10. Wherein a height of the base 23 is lower than that of the fixing post 21. A height of the standoff 25 mounted in the hole of the bumps 23 is equal to that of the fixing post 21.

Figure 2:
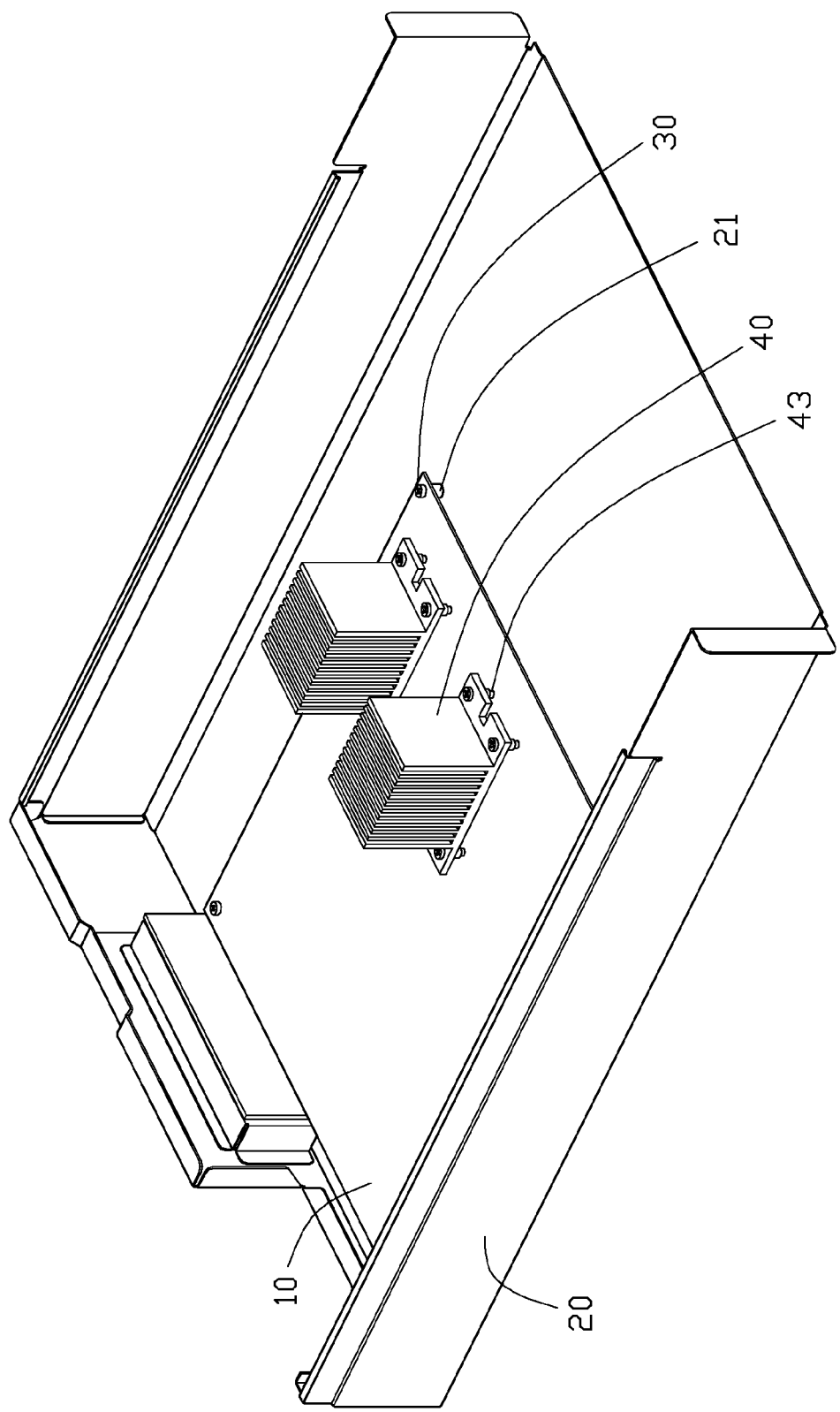
FIG. 2 is an assembled view of FIG. 1.

Referring to FIG. 2, in assembly of the first motherboard 10 in the chassis 20, the fixing post 21 and the standoffs 25 secured into the bumps 23 resist against and support the first motherboard 10. The screw holes defined in the fixing posts 21 align with the fixing holes 11, the securing holes 13 of the first motherboard 10 align with the mounting holes of the standoffs 25. The screws 30 extend through the fixing holes 11 and the screw holes of the fixing posts 21 thus securing the first motherboard 10 to the chassis 20. Then the heat sinks 40 are located on the CPU chips 15 respectively, four screws 43 protruding from a bottom of each of the heat sinks 40 extend through the securing holes 13 and the mounting holes of the standoffs 25 respectively for securing the heat sinks 40.

Figure 3:
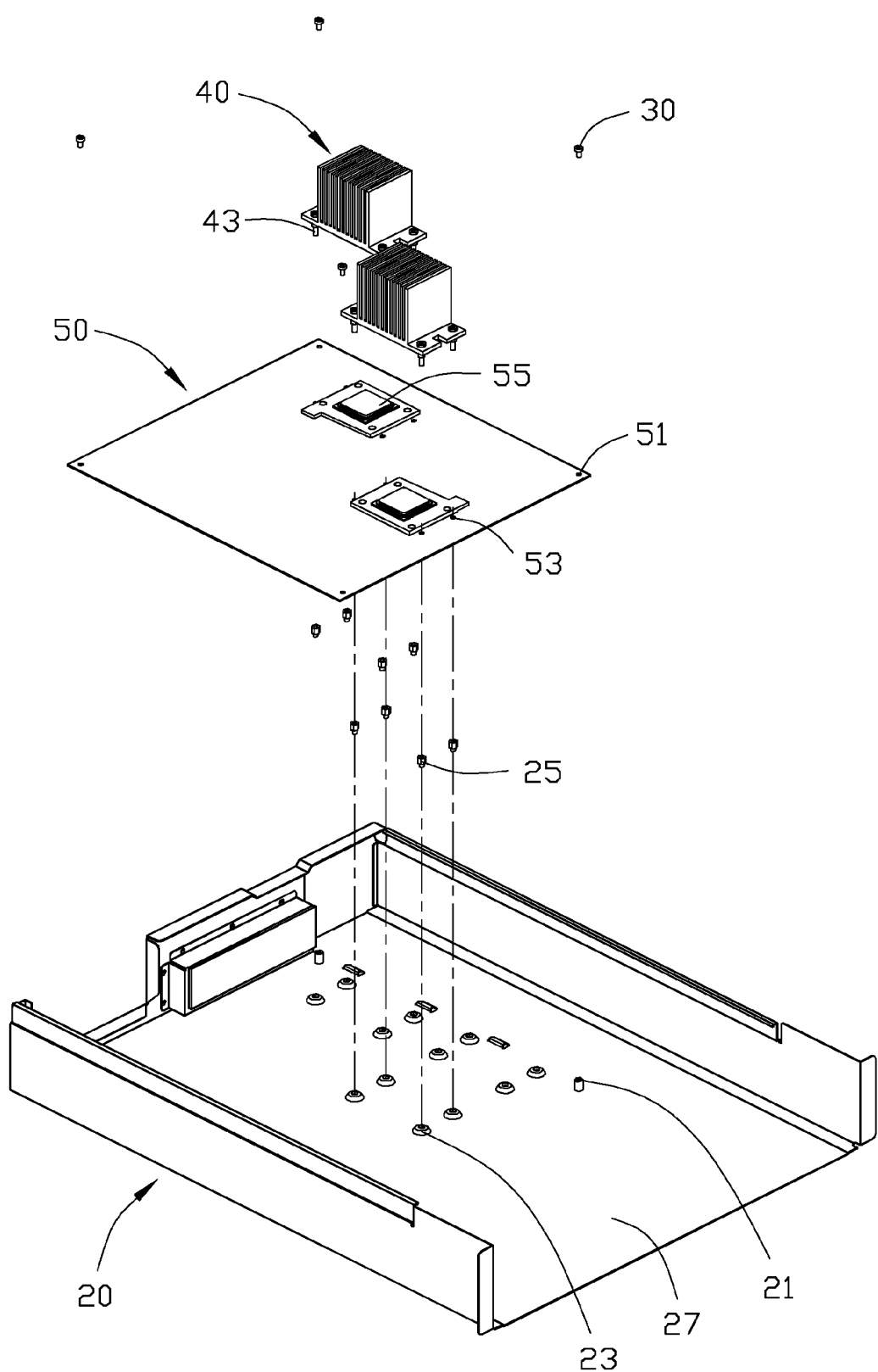
FIG. 3 is an exploded, isometric view of a computer system of a second preferred embodiment of the present invention, showing a second motherboard, a pair of heat sinks, and a chassis with knockdown standoffs adapted for the second motherboard.

Referring to FIG. 3, a second motherboard 50 is to be mounted into the chassis 20 instead of the first motherboard 10. The second motherboard 50 includes two CPU chips 55 diagonally mounted thereon. One of the CPU chips 55 is located in a different position from one of the CPU chips 15 of the first motherboard 10. Two groups of securing holes 53 are defined in the second motherboard 50 and located beside the CPU chips 55 respectively for mounting the heat sinks 40 on the CPU chips 55. The two groups each include four securing holes 53 beside each of the CPU chips 55. Four fixing holes 51 are defined in four corners of the second motherboard 20 respectively. Two diagonal groups of bumps 23 align with the securing holes 53 beside the CPU chips 55 of the second motherboard 50 respectively. The standoffs 25 are engaged in the two diagonal groups of bumps 23 for supporting the second motherboard 50.

Figure 4:
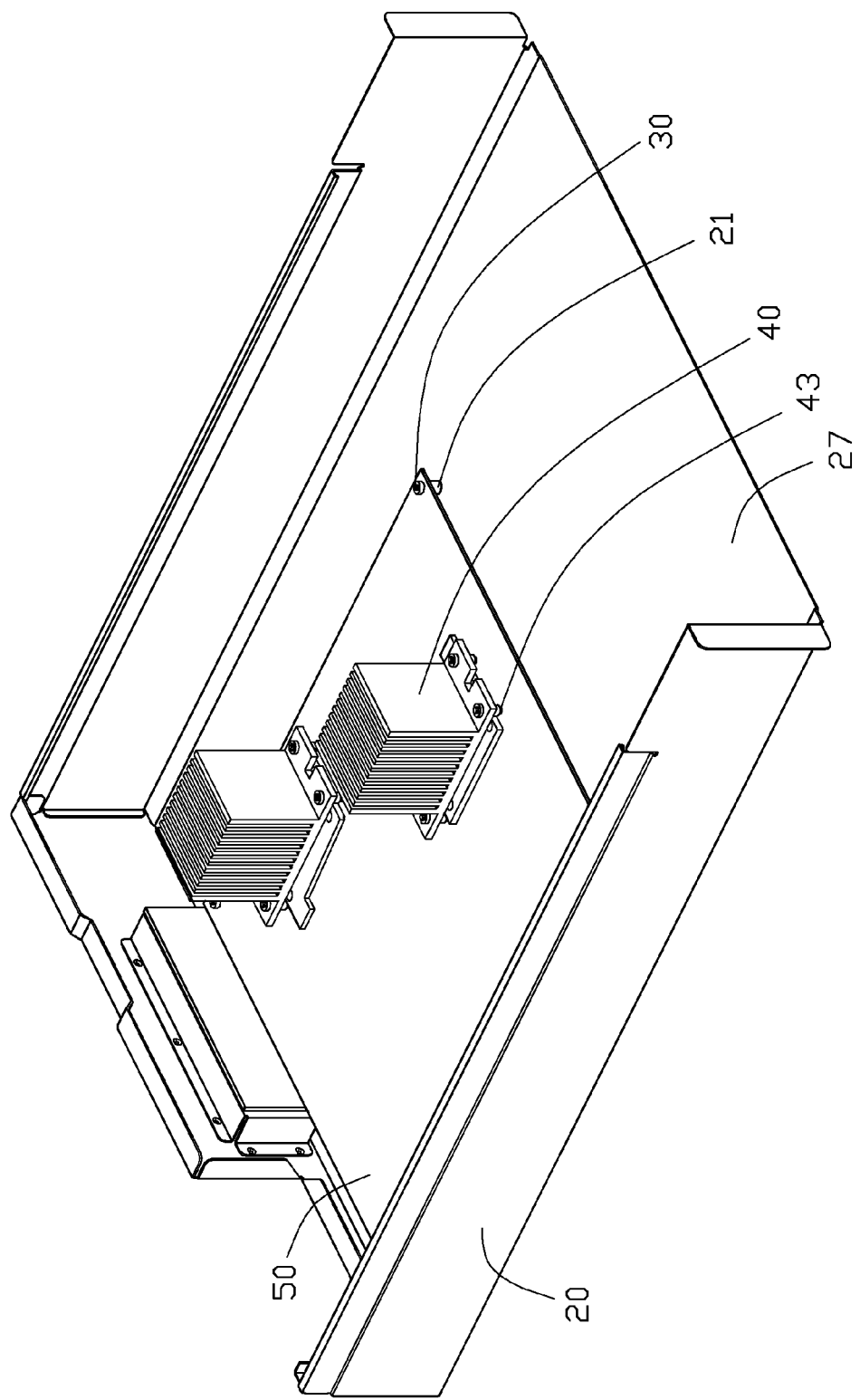
FIG. 4 is an assembled view of FIG. 3.

Referring to FIG. 4, the second motherboard 50 is mounted to the chassis 20 by a same method as mounting the first motherboard 10.

The standoffs 25 are removably mounted on the bumps 23 under the heat sinks 40 for mounting the heat sinks 40 on the CPU chips 15 or 55 and preventing the motherboard 10 or 50 from deformation. If users want to mount a different type of motherboard with CPU chips located at a different position, the standoffs 25 are removed from the original bumps 23 and mounted on the corresponding bumps 23 adapted for the different type motherboard. The bumps 23 that do not align with the CPU chips of the motherboard are spare and do not contact with the motherboard.

It is to be understood, however, that even though numerous characteristics and advantages have been set forth in the foregoing description of a preferred embodiment, together with details of the structure and function of the preferred embodiment, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A computer system, comprising:
   a motherboard, comprising at least one CPU chip mounted thereon and a plurality of securing holes defined therein for mounting a heat sink on the CPU chip; and
   a chassis, comprising a plurality of bumps each with a hole therein, and a plurality of knockdown standoffs, an amount of the standoffs being less than that of the bumps, the standoffs being mounted to the holes in the bumps coaxial with the securing holes beside the at least one CPU chip and resisting against an underside of the motherboard for supporting the heat sink.

2. The computer system as described in claim 1, wherein at least a fixing hole is defined in the motherboard, at least a fixing post corresponding to the fixing hole protrudes from the chassis.

3. The computer system as described in claim 2, wherein a screw hole is defined in the at least one fixing post, at least one screw extends through the at least one fixing hole of the motherboard and the screw hole of the at least one fixing post for mounting the motherboard to the chassis.

4. The computer system as described in claim 1, wherein the motherboard includes two CPU chips arrayed in-line, the chassis comprises three groups of bumps two groups of which each has a standoff mounted therein aligning with the two CPU chips.

5. The computer system as described in claim 1, wherein the motherboard includes two CPU chips arrayed diagonally, the chassis comprises three groups of bumps two groups of which each has a standoff mounted thereon aligning with the two CPU chips.

6. A computer system, comprising:
   a chassis comprising a panel configured to fit different types of motherboards which have two chips in different positions and a group of securing holes surrounding each of the chips, the panel having fixed thereon a plurality of groups of bumps arranged in different rows, each of the bumps defining a hole therein, and
   two groups of standoffs capable of being selectively removably mounted in the holes of two groups of bumps to align with the corresponding securing holes of the different types of motherboards, the standoffs being resisting against an underside of the motherboard and sandwiched between the two groups of bumps and the motherboard.

7. The computer system as claimed in claim 6, wherein a plurality of fixing posts is provided on the panel for supporting the motherboard.

8. The computer system as claimed in claim 7, wherein a height of the bump is lower than that of the fixing post, and a height of the bump combined with the standoff mounted thereon is equal to that of the fixing post.

9. The computer system as claimed in claim 6, wherein each group of bumps comprises four bumps.

10. The computer system as claimed in claim 6, wherein the bumps are spaced from the motherboard and coaxial with the securing holes.

* * * * *